United States Patent [19]

Kooi et al.

[11] 3,852,104

[45] Dec. 3, 1974

[54] METHOD OF MANUFACTURING A SEMICONDUCTOR DEVICE

[75] Inventors: Else Kooi; Reinier De Werdt, both of Eindhoven; Maria Magdalena Mathilda Nijdam-Paffen, Kerkrade, all of the Netherlands

[73] Assignee: U.S. Philips Corporation, New York, N.Y.

[22] Filed: Oct. 2, 1972

[21] Appl. No.: 293,782

[30] Foreign Application Priority Data

Oct. 2, 1971 Netherlands .......................... 7113561

[52] U.S. Cl. .................... 117/212, 29/571, 148/187, 156/11, 156/17, 357/23

[51] Int. Cl. .................................................. H01l 7/54

[58] Field of Search ...................... 156/8, 11, 16, 17; 317/234, 235; 148/175, 187; 29/571, 576, 580, 583; 117/212, 217

[56] References Cited

UNITED STATES PATENTS 3,418,227 12/1968 Cecil .................................. 156/17 X
3,425,879 2/1969 Shaw et al. ...................... 117/106 X
3,578,515 5/1971 Borrello et al. .................. 117/106 X
3,580,735 5/1971 Traynor .......................... 156/8 X
3,706,129 12/1972 McCann .............................. 29/583
3,755,001 8/1973 Kooi et al. ...................... 317/235 X
3,796,612 3/1974 Allison ............................ 156/17 X

*Primary Examiner*—William A. Powell
*Attorney, Agent, or Firm*—Frank R. Trifari; Jack Oisher

[57] ABSTRACT

A method of making a semiconductor device employing local or selective oxidation of a semiconductor while non-oxidized areas are protected by an oxidizing mask, wherein cracking of the oxidation mask is reduced by removing the mask edges that overhand a recess etched onto the semiconductor before carrying out the selective oxidation step.

5 Claims, 4 Drawing Figures

Figure 1:
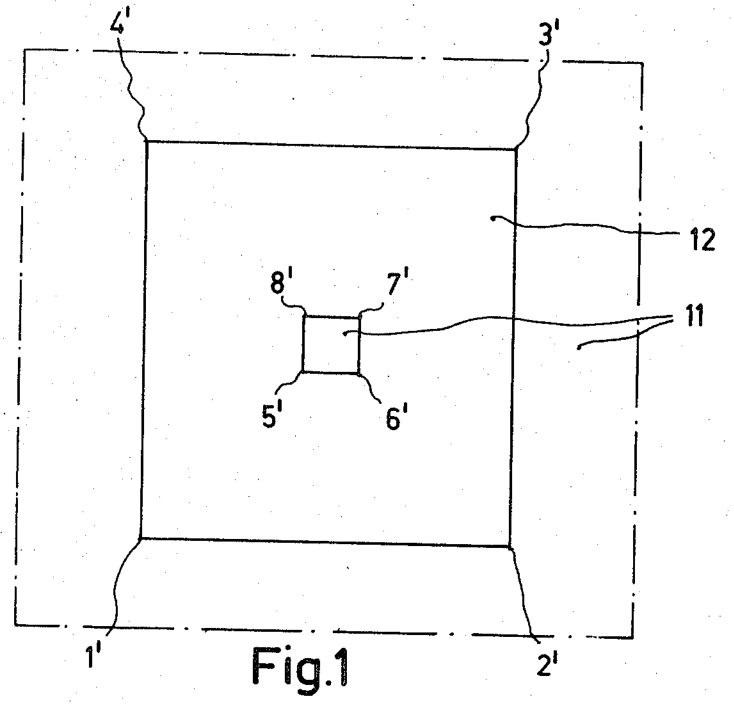

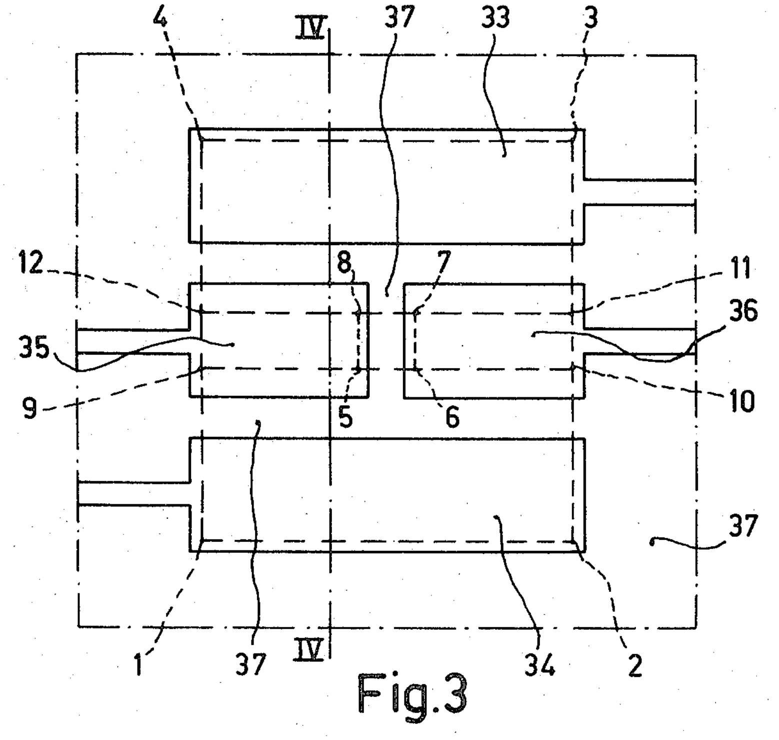
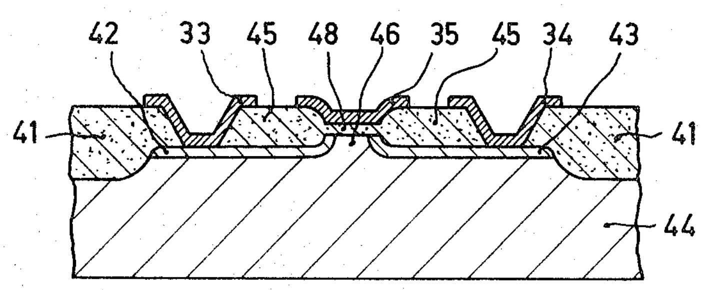
Fig.4

METHOD OF MANUFACTURING A SEMICONDUCTOR DEVICE

The invention relates to a method of manufacturing a semiconductor device in which a semiconductor body is provided on one side with an etchant-resistant and oxidation-resistant masking layer and the semiconductor body is subjected to an etching treatment by means of the masking layer to obtain recesses in the semiconductor body and to an oxidation treatment.

The invention furthermore relates to a semiconductor device manufactured by means of the said method.

The above-mentioned method is used in manufacturing semiconductor devices by means of the so-called Locos technique, which is an abbreviation of "local oxidation of silicon," in which upon selective oxidation of a silicon body employing an oxidation-resistant silicon-nitride-containing masking layer comparatively thick oxide layers can be obtained which are partly or wholly inset in the silicon body.

The method mentioned in the preamble is described, for example, in an article by J. A. Appels, E. Kooi, M. M. Paffen, J. J. H. Schatorje and W. M. C. G. Verkuylen in "Philips Research Reports," volume 25, pp. 118–132 (1970), in which, in order to obtain the inset oxide layer, recesses are etched in the silicon body, prior to the oxidation, using a patterned silicon nitride-containing masking layer as an etching mask.

During the etching treatment, the silicon below the masking layer is also etched and that over a distance which is approximately equal to the depth of the recess, for example 1 μm. In this case edges of the masking layer projecting over the edges of the recesses are obtained.

It has been found that after the oxidation treatment said edges may show cracks, particularly in the case of large angles in the masking layer. These cracks may extend from the edge inwards in the layer and deteriorate the quality of the masking layer when same is used in further processes, for example, when it is used as a masking in a later diffusion treatment or/and has to fulfil a function in the ultimate semiconductor device, for example for passivating the semiconductor surface. It is stated in the above-mentioned article that cracks in a silicon nitride-containing masking layer can be checked by forming silicon nitride or by treating the formed layer at a temperature which is equal to or higher than the temperature which is used during the oxidation treatment.

It has been found, however, that this measure does not always provide a satisfactory solution or cannot be used owing to processes already carried out.

It is an object of the invention to prevent the occurrence of cracks in the etchant-resistant and oxidation-resistant masking layer at least for the greater part without carrying out an extra thermal treatment. It is based on the recognition of the fact that, although the edges of the masking layer in themselves form no impedance during the oxidation treatment, said edges do not fulfil any essential function for many applications either.

The method described in the preamble is therefore characterized in that edges of the masking layer which project over the recesses are removed after the etching treatment and prior to the oxidation treatment.

It has been found that with the method according to the invention the masking layer after the oxidation treatment is substantially free from cracks, which is a result which is the more striking since also with the method according to the invention the semiconductor material is slightly oxidized below the masking layer in which same can be lifted by the forming oxide layer.

The removal of the edges is of particular importance when at the surface of the masking layer at least one angle is formed by the edges of said layer which is larger than 180° and preferably is approximately 270°.

The said edges can be removed, for example, by an ultrasonic treatment. In this case the possibility exists, however, that residues of the edges remain in the recesses or/and break only in a frayed manner.

In a preferred embodiment of the method according to the invention the projecting edges of the masking layer are therefore removed by means of an etching treatment which is specific for said layer.

A silicon nitride-containing masking layer is preferably used. The masking layer need not consist of one material but may also be composed of a number of component layers.

For example, masking layers are used which contain a silicon nitride layer and a silicon oxide layer, the latter layer adjoining the semiconductor body. The silicon nitride layer may also be covered with a silicon oxide layer.

Upon etching edges of a masking layer which consists only of silicon nitride, for example, etching is carried out in warm phosphoric acid in which the edge dissolves approximately two times as rapidly as the remainder of the silicon nitride layer since it is attacked on two sides. It should of course be taken into account upon providing the silicon nitride layer that in this and the two subsequent cases the remainder of the layer also dissolves partly upon etching away the edges.

Upon etching away of the edges of the masking layer which consists of silicon nitride with underlying silicon oxide, first the part of the edge consisting of oxide can be specifically dissolved, succeeded by the dissolution of the silicon nitride.

If, moreover, silicon oxide is still present on the silicon nitride and if this need not be retained, the procedure is carried out as described in the preceding case.

If the oxide on the nitride should remain intact at least partly, the thickness of the oxide situated on the nitride must be larger than that of the oxide situated below the nitride.

In this case no special measures need be taken for the thickness of the provided silicon nitride since in this case successively the part of the edge which consists of oxide and is situated below the nitride can be etched away on one side, the part of the edge consisting of nitride can be etched away on one side and the part of the edge consisting of oxide and situated on top of the nitride can be etched away on two sides.

The advantage of the preferred embodiment by means of etching is that the edges are removed completely. Furthermore, no extra masking and alignment step is necessary for the removal.

The invention furthermore relates to a semiconductor device manufactured by means of the method according to the invention.

Figure 2:
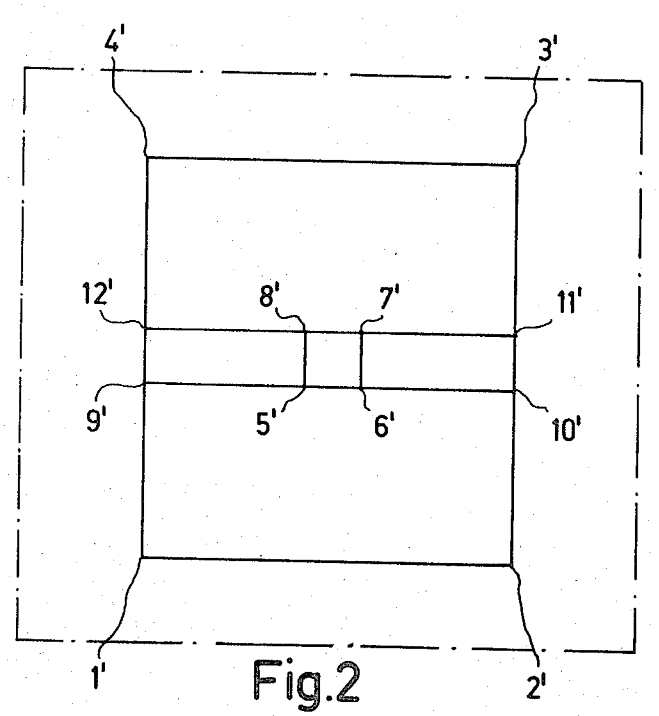

In order that the invention may be readily carried into effect, an embodiment thereof will now be described in greater detail, by way of example, with reference to the accompanying drawings, in which FIGS. 1 to 3 are diagrammatic plan views of a part of a semiconductor device in successive stages of manufacture by means of the method according to the invention and FIG. 4 is a sectional view of a part of a semiconductor device manufactured by means of the method according to the invention and taken on the line IV—IV of FIG. 3.

The manufacture of a circuit element consisting of two parallel MOS transistors of which the source regions and the drain regions are connected to form one common source region and one common drain region will now be described hereinafter by way of example.

The gate regions are separated and the whole of the said regions is surrounded by inset oxide layers.

Reference numeral 33 in FIG. 3 denotes the source electrode for the common source region (denoted by the broken-line rectangle 12, 11, 3, 4), reference numeral 34 denotes the drain electrode for the common drain region (denoted by the broken-line rectangle 1, 2, 10, 9), and reference numerals 35 and 36 denote the mutually separated gate electrodes of the parallel MOS transistors, which gate electrodes cover the channel regions denoted by the broken-line-rectangles 9, 5, 8, 12 and 6, 10, 11, 7, respectively. The gate electrodes 35 and 36 are insulated from the said channel regions in a silicon semiconductor body by silicon oxide layers inset in the silicon body.

Inset oxide layers 37 are visible between and around the electrodes.

In FIG. 4 the gate electrode 35 is shown with the silicon oxide layer 48 on the channel region 46 in the silicon body 44.

Starting material in manufacturing the said circuit element is an n-type silicon wafer in which a large number of circuit elements are formed and which wafer is then subdivided into separate elements.

The surface of a silicon body 44 for a circuit element to be formed is provided in a usual manner with an etchant-resistant and oxidation-resistant masking layer 11 which consists of a 0.07 μ thick silicon oxide layer, a 0.15 μ thick silicon nitride layer and on top of this a 0.4 μ thick silicon oxide layer (see FIG. 1). The last-mentioned oxide layer is covered with an etchant-resistant photolacquer layer 12 at the location which is denoted by the rectangle having the corners 1', 2', 3' and 4' in which is recessed the rectangle having the corners 5', 6', 7' and 8'. By means of usual methods, the parts of the overlying oxide layer not covered by the photolacquer layer are removed after which the photolacquer layer 12 is removed. The nitride layer is etched by means of the oxide layer lying on top of it as a masking and the oxide layer situated below the nitride layer is then etched. The oxide layer situated on the nitride layer is not entirely removed.

By means of the thus patterned remaining oxide-nitride-oxide layer 11 as an etchant-resistant and oxidation-resistant masking layer, the silicon body is locally subjected to a known etching treatment in which recesses, approximately 1 μ deep, are obtained in the silicon body, namely outside the rectangle (1', 2', 3', 4') and inside the rectangle (5' 6', 7', 8'). The silicon layer below the oxide-nitride-oxide masking layer 11 is etched laterally, also approximately 1 μ, edges of the masking layer projecting over the recesses being formed.

When in the presence of the said edges the etched silicon surface should be subjected to an oxidation treatment, cracks are formed at the surface of the masking layer, in particular there where large angles are made by the edges, for example angles of approximately 270°, i.e., near the corners 5', 6', 7' and 8', in which the cracks which are formed at a given corner and reach the cracks which are formed at another corner, which, as will be described below, will present problems in subjsequent processes or during the operation of the manufactured circuit element.

Therefore, according to the invention, the edges of the masking layer 11 projecting over the recesses are removed after the etching treatment and prior to the oxidation treatment.

According to the preferred embodiment to be described, the removal is carried out by means of an etching treatment which is specific for said layer.

In this embodiment, the part of the edge below the silicon nitride layer which consists of silicon oxide is removed by means of a usual etchant. The part of the edge consisting of silicon nitride is then removed by an etching treatment in a phosphoric acid solution at 180° C. Finally, the edge of the overlying silicon oxide layer is etched away, the edge of said layer dissolving two times as fast as the remainder of said layer.

When the edge has been dissolved, the thickness of the remainder of the overlying silicon oxide layer is approximately 0.1 μ.

By means of the oxide-nitride-oxide masking layer 11, the semiconductor body 44 is then subjected to the oxidation treatment in which in a usual manner an oxide layer 41 (see FIG. 4), 2 μ thick, is formed in approximately 16 hours the surface of which is approximately at the same level as the non-etched silicon surface. The semiconductor body is then masked (see FIG. 2) at the area of the rectangle 9', 10', 11', 12', and the non-masked rectangular part of masking layer 11 including the corners 12', 11', 3' and 4' and the part with the corners 1', 2', 10' and 9' are removed in a usual manner. During etching the oxide layers from the oxide-nitride-oxide masking layer, the thickness of the inset oxide layer 41 decreases relatively only little. In the now exposed parts of the silicon body p-type source and drain regions (12, 11, 3, 4 and 1, 2, 10, 9 in FIG. 3, corresponding to 42 and 43, respectively, in FIG. 4) are then diffused by means of the inset oxide layers and the remaining parts of oxide-nitride-oxide masking layer as a masking.

Without the removal of the edges, continuous cracks in the oxide-nitride-oxide masking layer could have formed during the oxidation treatment as a result of which shortcircuit could occur between the source and drain regions after the diffusion which is not the case when the edges are removed. After the diffusion of the source and drain regions 42 and 43, the silicon body 44 is again subjected to an oxidation treatment during which a comparatively thick oxide layer 45 is also formed on the diffused source and drain regions 42 and 43 and the thickness of the already present oxide layer 41 still slightly increases. Gate insulation is obtained by removing the remainders of the oxide layer and the nitride layer of the oxide-nitride-oxide masking layer 11 at the area of the rectangles 9', 5', 8', 12' and 6', 10', 11', 7' in FIG. 2, after which the remaining parts 48 of the oxide layer adjoining the silicon body 44 constitute the gate insulation.

The diffused regions 42 and 43 are finally provided in an usual manner with source and drain electrodes 33 and 34 and the gate insolation 48 is provided with the gate electrode 35 (and 36 in FIG. 3).

The invention is not restricted to the above-described example. For example, the semiconductor body may consist of silicon carbide. Instead of a silicon oxide layer, a layer of polycrystalline silicon may be used on the silicon nitride layer of the masking layer. A layer of aluminum oxide may be also be used as an etchant-resistant and oxidation-resistant masking layer.

What is claimed is:

1. A method of manufacturing a semiconductor device, comprising providing on one side of a semiconductor body a patterned etchant-resistant and oxidation-resistant masking layer, subjecting the semiconductor body to an etching treatment with an etchant which does not substantially attack the masking layer to form recesses in the semiconductor body at the unmasked areas, the semiconductor underetching at the masking layer edges whereby the latter project over the recesses, thereafter removing the masking layer edges which project over the recesses, and thereafter subjecting the masked body to an oxidation treatment with the masking layer in place to form an oxide inset in the body at the recesses, said oxidation treatment being continued until the surface of the grown oxide reaches at least the level of the masking layer.

2. A method as claimed in claim 1 wherein the patterned masking layer has edges which form at least one angle larger than 180°.

3. A method as claimed in claim 2 wherein the angle is approximately 270°.

4. A method as claimed in claim 1 wherein the projecting edges of the masking layer are removed by means of an etching treatment employing etchants which selectively attack said layer.

5. A method as claimed in claim 4 wherein the masking layer comprises silicon nitride.

* * * * *